United States Patent
Chou et al.

(10) Patent No.: US 10,673,427 B2
(45) Date of Patent: Jun. 2, 2020

(54) CIRCUIT CAPABLE OF PROTECTING LOW-VOLTAGE DEVICES

(71) Applicant: REALTEK SEMICONDUCTOR CORPORATION, Hsinchu (TW)

(72) Inventors: Chun-Ming Chou, Hsinchu (TW); Ming-Hui Tung, Hsinchu (TW); Chien-Wen Chen, Miaoli County (TW); Tsung-Yen Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/357,944

(22) Filed: Mar. 19, 2019

(65) Prior Publication Data
US 2019/0296732 A1    Sep. 26, 2019

(30) Foreign Application Priority Data
Mar. 21, 2018   (TW) .............................. 107109550 A

(51) Int. Cl.
*H03K 17/08*     (2006.01)
*H03K 17/0812*   (2006.01)
*H03K 17/687*    (2006.01)

(52) U.S. Cl.
CPC ..... *H03K 17/08122* (2013.01); *H03K 17/687* (2013.01)

(58) Field of Classification Search
CPC .. H03K 17/08; H03K 17/081; H03K 17/0812; H03K 17/08122
See application file for complete search history.

(56) References Cited

U.S. PATENT DOCUMENTS

| | | | |
|---|---|---|---|
| 7,446,574 B2 * | 11/2008 | Ohira ............... | G01R 19/16542 327/206 |
| 8,222,929 B1 | 7/2012 | Kwan | |
| 8,878,601 B2 * | 11/2014 | Sze .......................... | G05F 1/10 327/538 |

OTHER PUBLICATIONS

Taiwan Intellectual Property Office, Office Action dated Oct. 23 2018 in application 107109550. English summary on p. 1.

* cited by examiner

*Primary Examiner* — Hai L Nguyen
(74) *Attorney, Agent, or Firm* — WPAT, PC

(57) ABSTRACT

The present invention discloses a circuit capable of protecting low-voltage devices. The circuit includes: a pin configured to receive a signal of an external device; a control voltage generating circuit configured to generate a first control voltage according to a supply voltage to turn on a protected device when the supply voltage is at a high level, and generate a second control voltage according to a voltage of the pin to turn on the protected device when the supply voltage is at a low level; and the protected device configured to be turned on according to one of the first and the second control voltages and thereby electrically couple the pin with an internal circuit, in which the difference between the voltage of the pin and each of the first and the second control voltages is within a maximum withstanding voltage of the protected device.

10 Claims, 6 Drawing Sheets

CIRCUIT CAPABLE OF PROTECTING LOW-VOLTAGE DEVICES

BACKGROUND OF THE INVENTION

1. Field of the Invention

The present invention relates to a protecting circuit, especially to a circuit for protection of low-voltage devices.

2. Description of Related Art

An integrated circuit conventionally includes a high-voltage device for a high voltage operation. The high-voltage device is capable of preventing the integrated circuit from being damaged by a high voltage. However, components of an integrated circuit manufactured using an advanced node may only work under a low voltage, or an integrated circuit may be manufactured by a low voltage process instead of a high voltage one for cost reduction; in the above-mentioned circumstances, a circuit configuration with a cascode design may be used to protect those integrated circuits.

FIG. 1 shows a circuit configuration with a cascode design for protecting an integrated circuit with low-voltage devices. As shown in FIG. 1, the circuit configuration 100 includes a pin 110 and an NMOS transistor 120, in which the NMOS transistor 120 is a low-voltage device and connected with an internal circuit 12 in a cascode manner for providing protection for the internal circuit 12. The pin 110 receives the signal of an external device 14; when the NMOS transistor 120 is turned on, the signal of the external device 14 is transmitted via the pin 110 to the internal circuit 12. The NMOS transistor 120 is turned on or off according to a reference voltage $V_{REF}$ (e.g., 1.8 volt (V)), in which the reference voltage $V_{REF}$ may be originated from a stable supply voltage. When the stable supply voltage is at a high level (e.g., 3.3V or 1.8V), the NMOS 120 is turned on; in the meantime even though the voltage of the pin 110 is a high voltage (e.g., 3.3V), the voltage drop between two different terminals of the NMOS transistor 120 does not exceed the maximum withstanding voltage (e.g., 1.8V) of the NMOS transistor 120. However, when the stable supply voltage is at a low level (e.g., 0V), the NMOS transistor 120 is turned off; in the meantime if the voltage of the pin 110 is the high voltage, the voltage drop between two different terminals of the NMOS 120 can exceed the maximum withstanding voltage of the NMOS transistor 120 and thereby damages the NMOS transistor 120. For instance, assuming the internal circuit 12 is a USB device and the external device 14 is a host (e.g., a personal computer), at the moment that the external device 14 is electrically connected to the internal circuit 12 in the circuit configuration 100, the external device 14 may output a high voltage to the pin 110; meanwhile, the supply voltage may not be generated yet or may be at the aforementioned low level, and therefore the NMOS transistor 120 is not turned on; as a result, the high voltage of the pin 110 may cause the voltage drop between two different terminals of the NMOS transistor 120 to exceed the maximum withstanding voltage of the NMOS transistor 120, leading to possible damage of the NMOS transistor 120.

SUMMARY OF THE INVENTION

An object of the present invention is to provide a circuit capable of protecting low-voltage devices and preventing the problems of the prior art.

The present invention discloses a circuit capable of protecting low-voltage devices. An embodiment of the circuit includes a pin, a control voltage generating circuit and a protected device. The pin is configured to receive a signal of an external device. The control voltage generating circuit is configured to generate a first control voltage according to a supply voltage to turn on the protected device when the supply voltage is at a high level, and the control voltage generating circuit is further configured to generate a second control voltage according to a voltage of the pin to turn on the protected device when the supply voltage is at a low level. The protected device is configured to be turned on according to one of the first control voltage and the second control voltage and thereby electrically couple the pin with an internal circuit so as to allow the signal of the external device to be transmitted to the internal circuit, in which a voltage difference between the voltage of the pin and the first control voltage is within a maximum withstanding voltage of the protected device and a voltage difference between the voltage of the pin and the second control voltage is within the maximum withstanding voltage of the protected device.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this technical field. If any term is defined in the following description, such term should be interpreted according to the definitions in the description.

The disclosure of the present invention includes a circuit capable of protecting low-voltage devices. The circuit can provide a proper control voltage by using the voltage of a pin and thereby prevent the low-voltage devices from being damaged by an overly high voltage drop.

Figure 1:
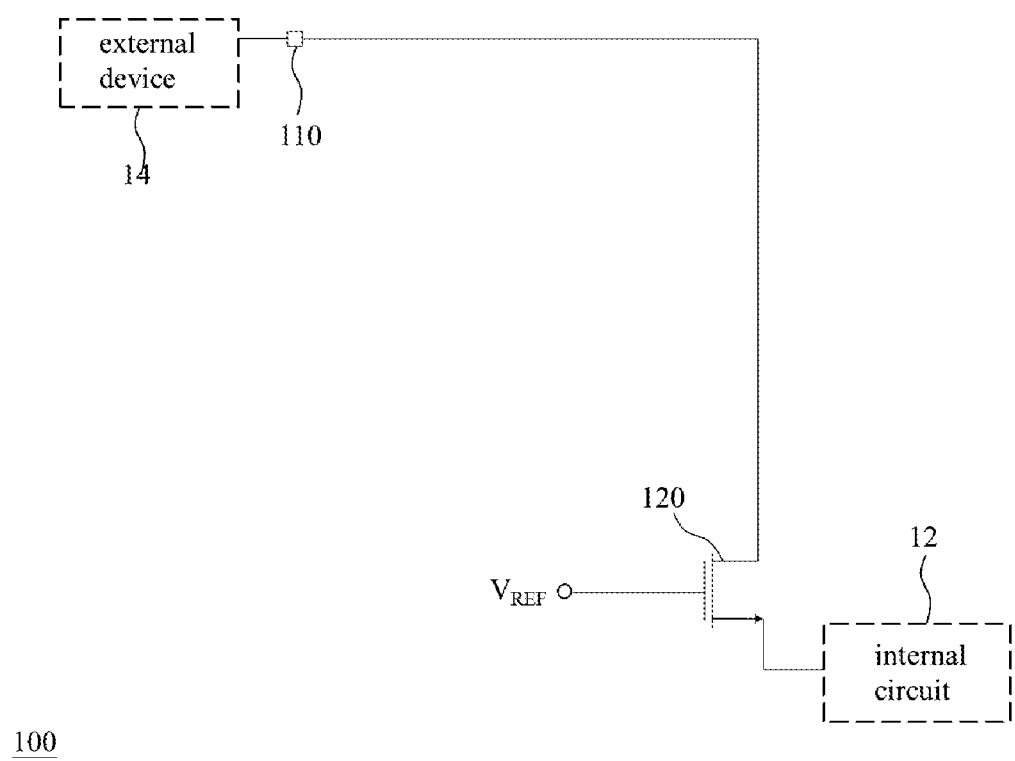
FIG. 1 shows a circuit configuration of the prior art for protecting an integrated circuit with low-voltage devices.
Figure 2:
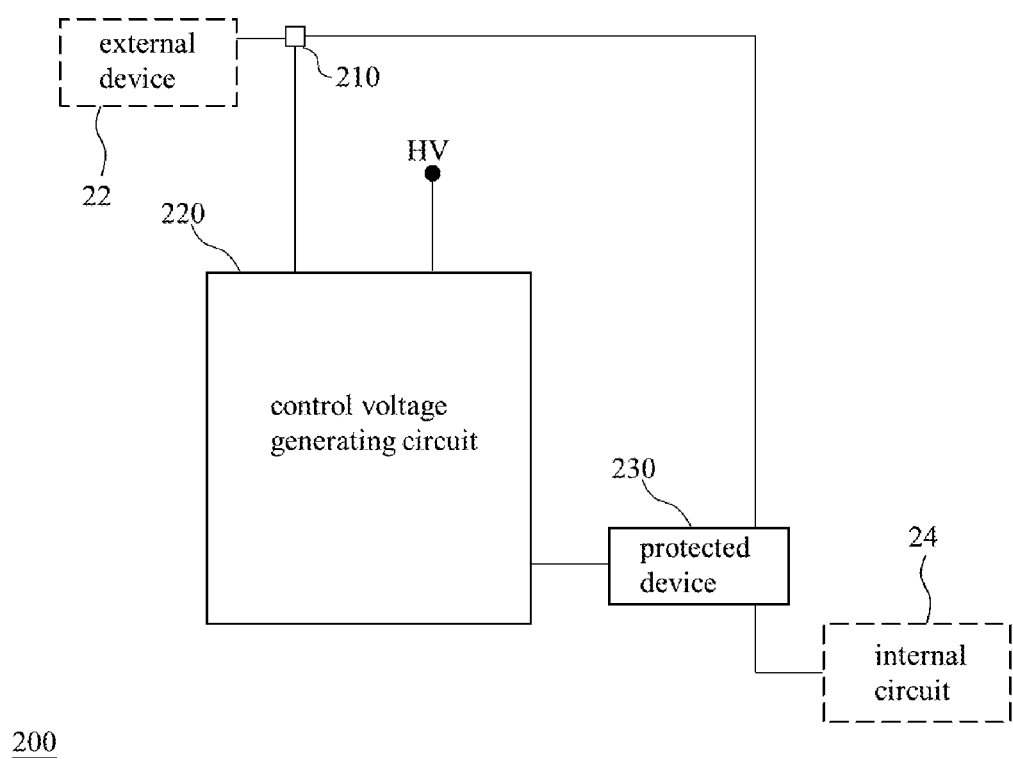
FIG. 2 shows an embodiment of the circuit of the present invention capable of protecting low-voltage devices.

FIG. 2 shows an embodiment of the circuit of the present invention. The circuit 200 of FIG. 2 includes a pin 210, a control voltage generating circuit 220 and a protected device 230.

Please refer to FIG. 2. The pin 210 is configured to receive the signal of an external device 22 and/or configured to transmit the signal of an internal circuit 24 to the external device 22, in which the external device 22 can be (or be included in) a first host or a first electronic device, and the internal circuit 24 can be (or be included in) a second electronic device capable of being electrically coupled to the first host or be (or be included in) a second host capable of being electrically coupled to the first electronic device. Each of the first host and the second host is a computer or an apparatus capable of executing digital data communication/operation. Each of the first electronic device and the second electronic device is a USB device or an electronic device capable of being connected to and disconnected from a host physically and electrically. It should be noted that in this embodiment the circuit 200 does not include the external device 22 and the internal circuit 24; in an alternative embodiment, the circuit 200 can optionally include the internal circuit 24.

Please refer to FIG. 2. The control voltage generating circuit 220 is configured to generate a first control voltage (e.g., 1.8 volt (V)) according to a supply voltage $V_{HV}$ of a voltage-supply terminal HV to turn on the protected device 230 when the supply voltage $V_{HV}$ is at a high level (e.g., 3.3V or 1.8V), in which the protected device 230 is electrically conductive after it is turned on. The control voltage generating circuit 220 is further configured to generate a second control voltage (e.g., 1.8V) according to a voltage of the pin 210 (e.g., 3.3V) to turn on the protected device 230 when the supply voltage $V_{HV}$ is at a low level (e.g., 0V). An exemplary implementation of the supply voltage $V_{HV}$ (e.g., the output voltage of a low-dropout regulator (LDO)) is a voltage independent of the voltage of the pin 210. At the moment of the external device 22 being electrically coupled to the internal circuit 24 through the circuit 200, the external device 22 may output a high voltage (e.g., 3.3V) to the pin 210; in the meantime the supply voltage $V_{HV}$ may not be generated yet or may be at the low level and thus the control voltage generating circuit 220 generates the second control voltage according to the high voltage of the pin 210 to prevent the protected device 230 from suffering an overly high voltage drop.

Please refer to FIG. 2. The protected device 230 (e.g., an NMOS transistor or the equivalent thereof) is configured to be turned on according to one of the first control voltage and the second control voltage and thereby electrically couple the external device 22 and the internal circuit 24 through the pin 210. Since the control voltage generating circuit 220 properly provides the first and the second control voltages, the voltage difference between the voltage of the pin 210 and the first control voltage is not higher than a maximum withstanding voltage (e.g., 1.8V) of the protected device 230 and the voltage difference between the voltage of the pin 210 and the second control voltage is not higher than the maximum withstanding voltage of the protected device 230. It should be noted that a maximum withstanding voltage of a device in this specification is the maximum voltage that the device can withstand in accordance with the design of the device.

Figure 3:
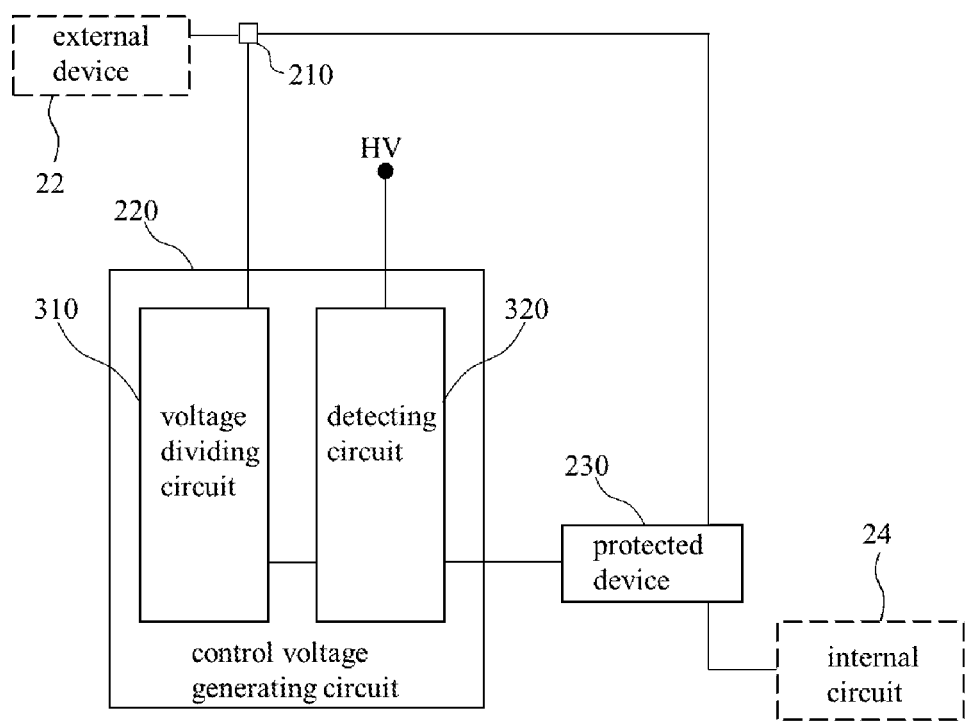
FIG. 3 shows an embodiment of the control voltage generating circuit of FIG. 2.
Figure 5:
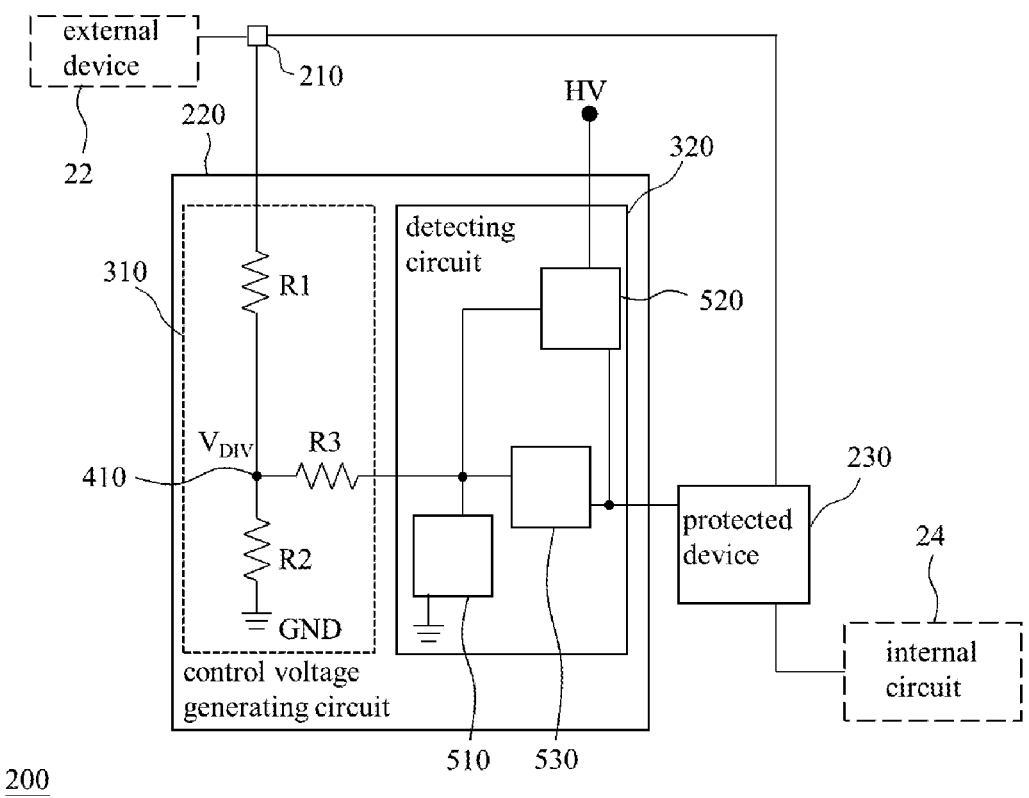
FIG. 5 shows an embodiment of the detecting circuit of FIG. 4.

FIG. 3 shows an embodiment of the control voltage generating circuit 220. The control voltage generating circuit 220 of FIG. 3 includes a voltage dividing circuit 310 and a detecting circuit 320. The voltage dividing circuit 310 is configured to generate a division voltage $V_{DIV}$ according to the voltage of the pin 210. The detecting circuit 320 is configured to output the supply voltage $V_{HV}$ as the first control voltage to the protected device 230 when the supply voltage $V_{HV}$ is at the high level; the detecting circuit 320 is further configured to output the division voltage $V_{DIV}$ or a derivative of the division voltage (e.g., the voltage from the resistor R3 to the protected device 230 as shown in FIG. 5, in which the voltage is equal to $V_{DIV}$) as the second control voltage to the protected device 230 when the supply voltage is at the low level. In this embodiment, the detecting circuit 320 includes a plurality of transistors (e.g., the first detecting circuit 510, the second detecting circuit 520 and the third detecting circuit 530 of FIG. 6), and the maximum withstanding voltage of each of the transistors is equal/similar to the maximum withstanding voltage of the protected device 230 or is not higher than 1.1 times 1.8V (i.e., 1.98V).

Figure 4:
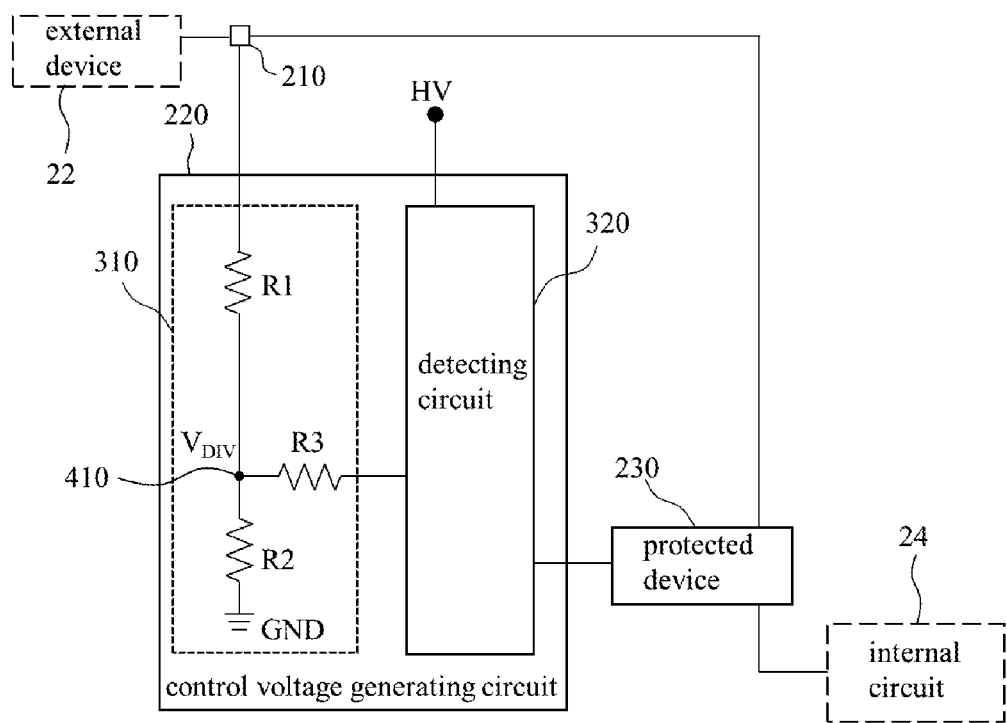
FIG. 4 shows an embodiment of the voltage dividing circuit of FIG. 3.

FIG. 4 shows an embodiment of the voltage dividing circuit 310 of FIG. 3. The voltage dividing circuit 310 of FIG. 4 includes a first resistor R1, a second resistor R2 and a third resistor R3. The first resistor R1 is coupled between the pin 210 and a node 410. The second resistor R2 is coupled between the node 410 and a low-voltage-source terminal GND (e.g., a grounding terminal). The third resistor R3 is coupled between the node 410 and the detecting circuit 320, in which a voltage of the node 410 is equal to the aforementioned division voltage $V_{DIV}$. In an exemplary implementation of this embodiment, the resistance of the first resistor R1 (e.g., 300 kΩ) is smaller than the resistance of the second resistor R2 (e.g., 360 kΩ) and smaller than the resistance of the third resistor R3 (e.g., 360 kΩ); therefore the detecting circuit 320 equivalently observes a high impedance in the direction of the voltage dividing circuit 310 so that the current flowing to the low-voltage-source terminal GND through the third resistor R3 and the detecting circuit 320 is decreased when the aforementioned supply voltage $V_{HV}$ is at the high level.

FIG. 5 shows an embodiment of the detecting circuit 320 of FIG. 4. The detecting circuit 320 of FIG. 5 includes a first detecting circuit 510, a second detecting circuit 520 and a third detecting circuit 530. The first detecting circuit 510 is coupled between the third resistor R3 and the low-voltage-source terminal GND, and the first detecting circuit 510 is configured to be turned on to output a voltage of the low-voltage-source terminal GND to the second detecting circuit 520 when the supply voltage $V_{HV}$ is at the high level. The second detecting circuit 520 is coupled between the voltage-supply terminal HV and the protected device 230, the second detecting circuit 520 is configured to be turned on according to the voltage of the low-voltage-source terminal GND to output the supply voltage $V_{HV}$ as the first control voltage to the protected device 230 when the supply voltage $V_{HV}$ is at the high level, and the second detecting circuit 520 is further configured to be turned off according to the aforementioned division voltage $V_{DIV}$ or the derivative thereof when the supply voltage $V_{HV}$ is at the low level. The third detecting circuit 530 is coupled between the third resistor R3 and the protected device 230, the third detecting circuit 530 is configured to be turned off when the supply voltage $V_{HV}$ is at the high level, and the third detecting circuit 530 is configured to be turned on to output the division voltage $V_{DIV}$ or the derivative thereof as the second control voltage to the protected device 230 when the supply voltage $V_{HV}$ is at the low level.

Figure 6:
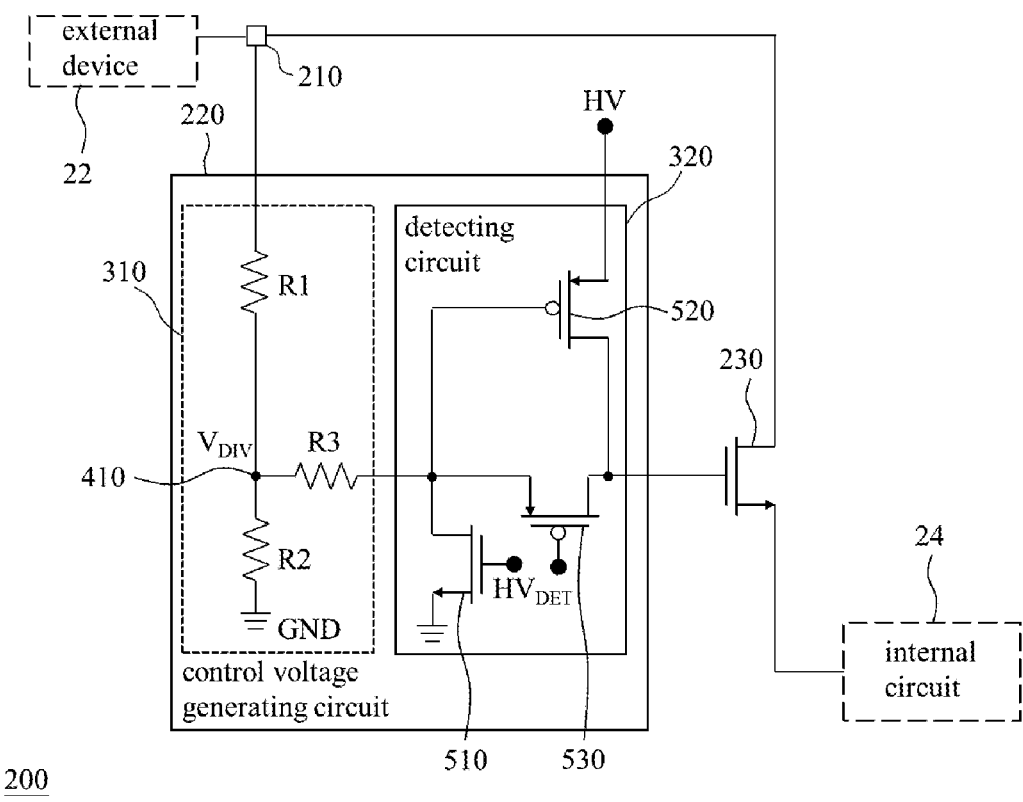
FIG. 6 shows an exemplary implementation of the detecting circuit of FIG. 5.

FIG. 6 shows an embodiment of the detecting circuit 320 of FIG. 5. As shown in FIG. 6, the first detecting circuit 510 is an NMOS transistor and each of the second detecting circuit 520 and the third detecting circuit 530 is a PMOS transistor; in addition, the protected device 230 in this embodiment is an NMOS transistor. The NMOS transistor of the first detecting circuit 510 is configured to be turned on or off according to a supply-voltage detection signal $HV_{DET}$ (e.g., 1.8V for a high level $V_{HV}$ or 0V for a low level $V_{HV}$); when the supply voltage $V_{HV}$ is at the high level, the supply-voltage detection signal $HV_{DET}$ has the NMOS transistor be turned on so that the voltage of the drain terminal of the NMOS transistor is equal to the voltage of the source terminal of the NMOS transistor (i.e., the voltage of the aforementioned low-voltage-source terminal GND). The PMOS transistor of the second detecting circuit 520 is configured to be turned on according to the voltage of the low-voltage-source terminal GND to output the supply voltage $V_{HV}$ as the first control voltage to the protected device 230 when the NMOS transistor of the first detecting circuit 510 is turned on; The PMOS transistor of the second detecting circuit 520 is further configured to be turned off according to the aforementioned division voltage $V_{DIV}$ or the derivative thereof when the NMOS transistor of the first detecting circuit 510 is turned off. The PMOS transistor of the third detecting circuit 530 is configured to be turned on or off according to the supply-voltage detection signal $HV_{DET}$; more specifically, when the supply voltage $V_{HV}$ is at the high level, the supply-voltage detection signal $HV_{DET}$ has the PMOS transistor of the third detecting circuit 530 be turned off, and when the supply voltage $V_{HV}$ is at the low level, the supply-voltage detection signal $HV_{DET}$ has the PMOS transistor of the third detecting circuit 530 be turned on to output the division voltage $V_{DIV}$ or the derivative thereof as the second control voltage to the protected device 230.

It should be noted that people of ordinary skill in the art can implement the present invention by selectively using some or all of the features of any embodiment in this specification or selectively using some or all of the features of multiple embodiments in this specification as long as such implementation is practicable, which implies that the present invention can be carried out flexibly.

To sum up, the present invention can use the voltage of a pin to ensure the bias of a protected device being proper when a supply voltage is incapable of making the bias of the protected device appropriate; in other words, the present invention can prevent the voltage drop between two different terminals of the protected device (e.g., any two terminals among the gate terminal, the drain terminal, the source terminal and the bulk terminal of the protected device) from exceeding an upper limit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A circuit capable of protecting low-voltage devices, comprising:
    a pin configured to receive a signal of an external device;
    a control voltage generating circuit configured to generate a first control voltage according to a supply voltage to turn on a protected device when the supply voltage is at a first level, and the control voltage generating circuit configured to generate a second control voltage according to a voltage of the pin to turn on the protected device when the supply voltage is at a second level, wherein the supply voltage at the first level is on a level which is sufficient for turning on the protected device and the supply voltage at the second level is on a level which is insufficient for turning on the protected device, and the control voltage generating circuit includes:
        a voltage dividing circuit configured to generate a division voltage according to the voltage of the pin; and
        a detecting circuit configured to output the supply voltage as the first control voltage to the protected device when the supply voltage is at the first level, and the detecting circuit configured to output the division voltage or a derivative of the division voltage as the second control voltage to the protected device when the supply voltage is at the second level; and
    the protected device configured to be turned on according to one of the first control voltage and the second control voltage and thereby electrically couple the pin with an internal circuit.

2. The circuit of claim 1, wherein the protected device is an NMOS transistor.

3. The circuit of claim 1, wherein the detecting circuit includes a plurality of transistors, and a maximum withstanding voltage of each of the transistors is equal to a maximum withstanding voltage of the protected device or not higher than 1.1 times 1.8 volt.

4. The circuit of claim 1, wherein the voltage dividing circuit includes:
    a first resistor coupled between the pin and a node;
    a second resistor coupled between the node and a low-voltage-source terminal; and
    a third resistor coupled between the node and the detecting circuit, in which a voltage of the node is equal to the division voltage.

5. The circuit of claim 4, wherein a resistance of the first resistor is smaller than a resistance of the second resistor and smaller than a resistance of the third resistor.

6. The circuit of claim 5, wherein the resistance of the second resistor is equal to the resistance of the third resistor.

7. The circuit of claim 4, wherein the detecting circuit includes:
    a first detecting circuit coupled between the third resistor and the low-voltage-source terminal, and the first detecting circuit configured to be turned on to output a voltage of the low-voltage-source terminal to a second detecting circuit when the supply voltage is at the first level;
    the second detecting circuit coupled between a voltage-supply terminal and the protected device, the second detecting circuit configured to be turned on according to the voltage of the low-voltage-source terminal to output the supply voltage as the first control voltage to the protected device when the supply voltage is at the first level, and the second detecting circuit configured to be turned off according to the division voltage or the derivative of the division voltage when the supply voltage is at the second level; and
    a third detecting circuit coupled between the third resistor and the protected device, the third detecting circuit configured to be turned off when the supply voltage is at the first level, and the third detecting circuit configured to be turned on to output the division voltage or the derivative of the division voltage as the second control voltage to the protected device when the supply voltage is at the second level.

8. The circuit of claim 7, wherein the first detecting circuit is an NMOS transistor and each of the second detecting circuit and the third detecting circuit is a PMOS transistor.

9. The circuit of claim 1, wherein the detecting circuit includes:
    a first detecting circuit coupled between the voltage dividing circuit and a low-voltage-source terminal, and the first detecting circuit configured to be turned on to output a voltage of the low-voltage-source terminal to a second detecting circuit when the supply voltage is at the first level;
    the second detecting circuit coupled between a voltage-supply terminal and the protected device, the second detecting circuit configured to be turned on according to the voltage of the low-voltage-source terminal to output the supply voltage as the first control voltage to the protected device when the supply voltage is at the first level, and the second detecting circuit configured to be turned off according to the division voltage or the derivative of the division voltage when the supply voltage is at the second level; and a third detecting circuit coupled between the voltage dividing circuit and the protected device, the third detecting circuit configured to be turned off when the supply voltage is at the first level, and the third detecting circuit configured to be turned on to output the division voltage or the derivative of the division voltage as the second control voltage to the protected device when the supply voltage is at the second level.

10. The circuit of claim 9, wherein the first detecting circuit is an NMOS transistor and each of the second detecting circuit and the third detecting circuit is a PMOS transistor.

* * * * *